(12) United States Patent
Takinami et al.

(10) Patent No.: US 9,130,737 B1
(45) Date of Patent: Sep. 8, 2015

(54) SIGNAL-GENERATING CIRCUIT AND WIRELESS COMMUNICATION DEVICE

(71) Applicant: Panasonic Corporation, Osaka (JP)

(72) Inventors: Koji Takinami, Kanagawa (JP);
Takayuki Tsukizawa, Kanagawa (JP);
Kenji Miyanaga, Kanagawa (JP);
Shunsuke Hirano, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/610,271

(22) Filed: Jan. 30, 2015

(30) Foreign Application Priority Data

Feb. 17, 2014 (JP) ................. 2014-027585

(51) Int. Cl.
*H03D 3/24* (2006.01)
*H04L 7/033* (2006.01)
*H04B 1/405* (2015.01)
*H04B 1/00* (2006.01)
*H03L 7/18* (2006.01)
*H03L 7/193* (2006.01)
*H03L 7/16* (2006.01)

(52) U.S. Cl.
CPC ............... *H04L 7/0331* (2013.01); *H03L 7/16* (2013.01); *H03L 7/18* (2013.01); *H03L 7/193* (2013.01); *H04B 1/005* (2013.01); *H04B 1/405* (2013.01)

(58) Field of Classification Search
CPC ...... H04B 1/403; H03L 7/18; H03L 2207/06; H03L 7/08; H03L 7/10; H03L 7/23; H03L 7/83; H03L 7/193; H03L 7/1974; H03L 7/0891; H03L 7/093; H03L 7/083; H03L 7/16; H03C 3/0916; H03C 3/095; H03C 3/0933
USPC ................. 375/295, 344, 371, 373, 375, 376; 327/141, 147, 150, 155, 156, 159
See application file for complete search history.

(56) References Cited

U.S. PATENT DOCUMENTS

| 4,551,689 | A | * | 11/1985 | Scala et al. ................... 331/2 |
| 6,121,747 | A | * | 9/2000 | Trachtenberg ............. 318/800 |
| 6,294,935 | B1 | * | 9/2001 | Ott ............................. 327/150 |
| 6,747,987 | B1 | * | 6/2004 | Meador et al. ............. 370/465 |
| 7,106,805 | B2 | * | 9/2006 | Atkinson et al. .......... 375/295 |
| 2006/0132202 | A1 | * | 6/2006 | Meltzer ....................... 327/156 |
| 2009/0061795 | A1 | | 3/2009 | Doan et al. |
| 2011/0116655 | A1 | * | 5/2011 | Chen ............................. 381/98 |

* cited by examiner

*Primary Examiner* — Tesfaldet Bocure
(74) *Attorney, Agent, or Firm* — Greenblum & Bernstein P.L.C.

(57) ABSTRACT

A signal-generating circuit includes a voltage-controlled oscillator that generates an oscillated signal; a first frequency divider that generates a first divided signal by dividing the oscillated signal; a second frequency divider that generates a second divided signal by dividing the divided signal; a phase comparator that receives as input the second divided signal and a reference signal and outputs two signals corresponding to a phase difference therebetween; a loop filter that extracts a low frequency signal between the two signals to be output to the voltage-controlled oscillator; a third frequency divider that generates a third divided signal by dividing the first divided signal; a first frequency converter that generates a first frequency converted signal by multiplying the oscillated signal by the third divided signal; and a first multiplier that generates a multiplied signal by multiplying the first frequency converted signal by a first multiplication number.

9 Claims, 8 Drawing Sheets

FIG. 2

| FREQUENCY OF REFERENCE SIGNAL | OSCILLATION FREQUENCY OF VCO 100 | DIVISION RATIO N1 OF FIRST FREQUENCY DIVIDER 101 | DIVISION RATIO N2 OF SECOND FREQUENCY DIVIDER 102 | DIVISION RATIO N3 OF THIRD FREQUENCY DIVIDER 105 | MULTIPLICATION NUMBER M OF MULTIPLIER 107 | OUTPUT FREQUENCY |
|---|---|---|---|---|---|---|
| 40 MHz | 32.4 GHz | 5 | 162 | 2 | | 58.32 GHz |
| | | | | 3 | | 60.48 GHz |
| | | | | 6 | | 62.64 GHz |
| | | | | THROUGH MODE (TURN OFF INPUT TO FREQUENCY CONVERTER 106) | 2 | 64.80 GHz |

FIG. 3

| FREQUENCY OF REFERENCE SIGNAL | OSCILLATION FREQUENCY OF VCO 100 | DIVISION RATIO N1 OF FIRST FREQUENCY DIVIDER 101 | DIVISION RATIO N2 OF SECOND FREQUENCY DIVIDER 102 | DIVISION RATIO N3 OF THIRD FREQUENCY DIVIDER 105 | MULTIPLICATION NUMBER M OF MULTIPLIER 107 | OUTPUT FREQUENCY |
|---|---|---|---|---|---|---|
| 40 MHz | 16.2 GHz | 5 | 81 | 2 | 4 | 58.32 GHz |
| | | | | 3 | | 60.48 GHz |
| | | | | 6 | | 62.64 GHz |
| | | | | THROUGH MODE (TURN OFF INPUT TO FREQUENCY CONVERTER 106) | | 64.80 GHz |

FIG. 4

| FREQUENCY OF REFERENCE SIGNAL | OSCILLATION FREQUENCY OF VCO 100 | DIVISION RATIO N1 OF FIRST FREQUENCY DIVIDER 101 | DIVISION RATIO N2 OF SECOND FREQUENCY DIVIDER 102 | DIVISION RATIO N3 OF THIRD FREQUENCY DIVIDER 105 | MULTIPLICATION NUMBER M OF MULTIPLIER 107 | OUTPUT FREQUENCY |
|---|---|---|---|---|---|---|
| 40 MHz | 32.4 GHz | 1 | 162 | 12 | 2 | 59.40 GHz |
| | | | | 20 | | 61.56 GHz |
| | | | | 60 | | 63.72 GHz |

PRIOR ART

SIGNAL-GENERATING CIRCUIT AND WIRELESS COMMUNICATION DEVICE

CROSS REFERENCES TO RELATED APPLICATIONS

This application claims priority to Japanese Patent Application No. 2014-027585, filed on Feb. 17, 2014, the contents of which are hereby incorporated by reference.

BACKGROUND

1. Technical Field

The present disclosure relates to signal-generating circuits that generate high-frequency signals.

2. Description of the Related Art

In wireless communication devices, PLL frequency synthesizers are primarily used as signal-generating circuits for generating desired high-frequency signals. Voltage-controlled oscillators (VCOs) are widely used in PLL frequency synthesizers. Voltage-controlled oscillators have a narrow variable frequency range and are thus hard to employ when a broad variable frequency range is required or when a high frequency is used. In high-speed wireless communication (e.g., IEEE 802.11ad) that uses a 60 GHz band, or millimeter waves, for example, four channels at 58.32 GHz, 60.48 GHz, 62.64 GHz, and 64.80 GHz are assigned within a 9 GHz band ranging from 57 GHz to 66 GHz, and it is thus difficult to handle all four channels.

Addressing such an issue, U.S. Pat. No. 8,229,352 discloses a technique that enables a voltage-controlled oscillator to handle the four frequencies required in the 60 GHz band by fixing an oscillation frequency of the voltage-controlled oscillator.

SUMMARY

The technique disclosed in U.S. Pat. No. 8,229,352, however, uses a heterodyne system in which a frequency is converted twice, and thus a plurality of frequency converters and IF modules are required, which leads to a problem in that the configuration becomes complicated and the power consumption increases. In addition, a chip area increases when integrating in a semiconductor process, which leads to another problem in that the fabrication cost increases.

One non-limiting and exemplary embodiment provides a signal-generating circuit that has a simple configuration and that can achieve a broad variable frequency range at a high frequency.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a signal-generating circuit that outputs a high-frequency signal while switching among a plurality of frequencies, and the signal-generating circuit includes a voltage-controlled oscillator, a first frequency divider that divides an output of the voltage-controlled oscillator, a second frequency divider that divides an output of the first frequency divider, a phase comparator that receives as input an output of the second frequency divider and a reference signal and outputs a signal corresponding to a phase difference between the output of the second frequency divider and the reference signal, a loop filter that extracts a low frequency signal of an output of the phase comparator and outputs the low frequency signal to the voltage-controlled oscillator as a frequency controlling signal therefor, a third frequency divider that divides an output of the first frequency divider, a first frequency converter that receives as input an output of the third frequency divider and an output of the voltage-controlled oscillator and carries out frequency conversion, and a first multiplier that multiplies an output of the first frequency converter and outputs a multiplied result.

According to the present disclosure, a broad variable frequency range can be achieved at a high frequency with a simple configuration.

These general and specific aspects may be implemented using a system, a method, and a computer program, and any combination of systems, methods, and computer programs.

BRIEF DESCRIPTION OF THE DRAWINGS

FIG. 2 illustrates first examples of numerical values for the signal-generating circuit according to the first embodiment;

FIG. 3 illustrates second examples of numerical values for the signal-generating circuit according to the first embodiment;

FIG. 4 illustrates third examples of numerical values for the signal-generating circuit according to the first embodiment;

DETAILED DESCRIPTION

Hereinafter, embodiments of the present disclosure will be described with reference to the drawings.
(Underlying Knowledge Forming Basis of the Present Disclosure)

In a wireless communication device, a frequency synthesizer is primarily used as a signal-generating circuit for generating a desired high-frequency signal. A phase locked loop (PLL) that includes a voltage-controlled oscillator (VCO), a frequency divider, a phase comparator, and a loop filter is widely used in a frequency synthesizer. In such a PLL, the oscillation frequency of the voltage-controlled oscillator is adjusted through feedback control so as to generate a high-frequency signal having a desired frequency.

In a typical wireless communication device, a frequency synthesizer to be used to convert the frequencies of a transmission signal and a reception signal is required to have a broad variable frequency range in order to meet the need for handling a plurality of frequency channels used in a communication system. Furthermore, a frequency synthesizer is required to have low-phase-noise characteristics in order to suppress a deterioration in the signal quality of a modulation signal.

It is widely known that there is a trade-off between the variable frequency range and the phase noise characteristics in a voltage-controlled oscillator used in a frequency synthesizer. Furthermore, as the operation frequency increases, for example, the variable frequency range becomes narrower due to the influence of a parasitic capacitance component, and thus it is difficult to achieve both a broad variable frequency range and low-phase-noise characteristics at a high frequency.

In high-speed wireless communication (e.g., IEEE 802.11ad) that uses a 60 GHz band, or millimeter waves, for example, four channels at 58.32 GHz, 60.48 GHz, 62.64 GHz, and 64.80 GHz are assigned within a 9 GHz band ranging from 57 GHz to 66 GHz, but it is difficult to handle all four channels with a single voltage-controlled oscillator.

Figure 8:
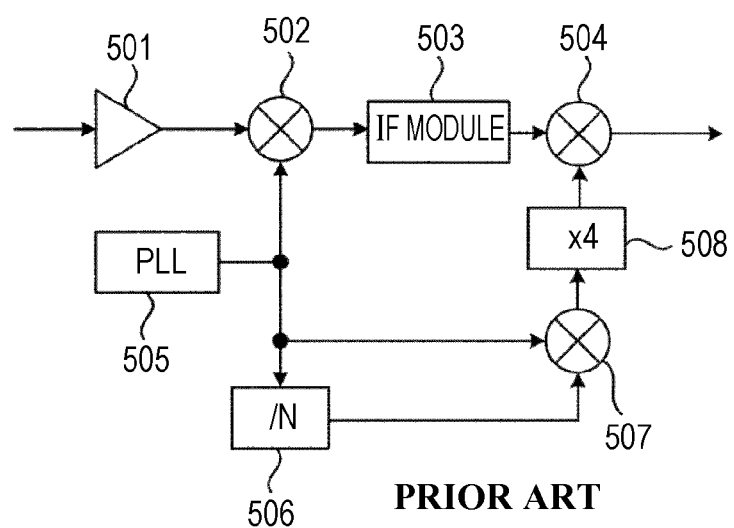
FIG. 8 is a block diagram illustrating a signal-generating circuit according to the technique disclosed in U.S. Pat. No. 8,229,352.

Addressing such an issue, U.S. Pat. No. 8,229,352 discloses a technique that enables a voltage-controlled oscillator to handle the four frequencies required in the 60 GHz band by fixing the oscillation frequency of the voltage-controlled oscillator. FIG. 8 is a block diagram illustrating a signal-generating circuit according to the aforementioned technique. In FIG. 8, a signal received through an antenna (not illustrated) is amplified by a low-noise amplifier 501, and the amplified signal is then converted to a signal of an intermediate frequency band (IF) by a first frequency converter 502 and is outputted as an IF signal. An IF signal outputted from the first frequency converter 502 is amplified and subjected to bandlimiting filtering in an IF module 503 and is then converted to a baseband by a second frequency converter 504.

The first frequency converter 502 uses an output signal of a PLL 505 as a local signal. A frequency divider 506 divides an output of the PLL 505, and the resulting signal is multiplied by an output signal of the PLL 505 in a third frequency converter 507. A multiplier 508 then converts the resulting signal so as to raise the frequency thereof four-fold, and the second frequency converter 504 uses the resulting signal as a local signal. Although a reception system is illustrated in FIG. 8, a transmission system can be configured in a similar manner, and descriptions thereof will be omitted.

According to the technique described in U.S. Pat. No. 8,229,352, an example is illustrated in which, as examples of numerical values, the division ratio of the frequency divider 506 is set to any one of "8," "12," and "24" and the outputs of the third frequency converter 507 are set to 58.32 GHz, 60.48 GHz, 62.64 GHz, and 64.80 GHz. Through this, the oscillation frequency of a voltage-controlled oscillator (not illustrated) used in the PLL 505 can be fixed at 12.96 GHz.

The technique described in U.S. Pat. No. 8,229,352 uses a heterodyne system in which a frequency is converted twice, and thus a plurality of frequency converters and IF modules are required, which leads to a problem in that the configuration becomes complicated and the power consumption increases. In addition, a chip area increases when integrating in a semiconductor process, which leads to another problem in that the fabrication cost increases.

Hereinafter, a signal-generating circuit that has a simple configuration and that can achieve a broad variable frequency range at a high frequency will be described.

(First Embodiment)

Figure 1:
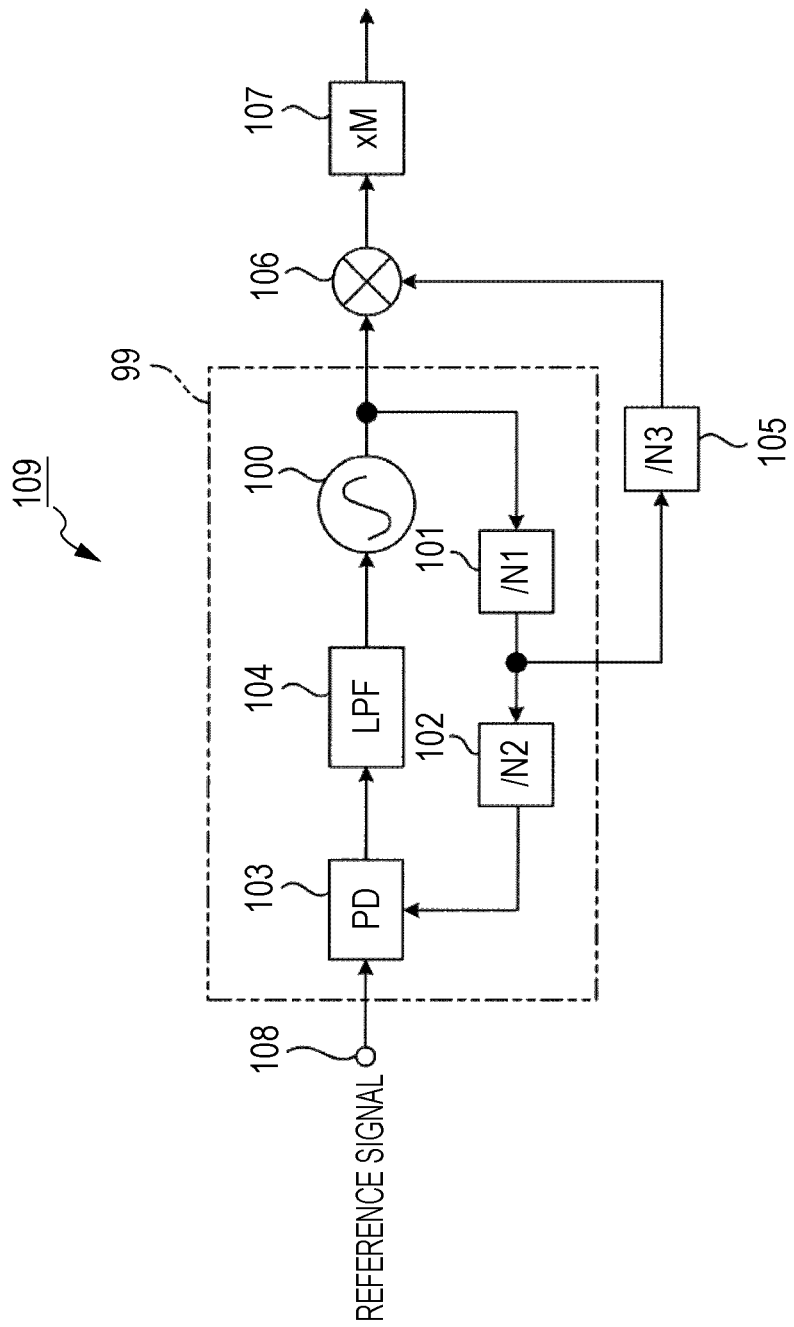
FIG. 1 is a block diagram illustrating a signal-generating circuit according to a first embodiment.

FIG. 1 is a block diagram illustrating a signal-generating circuit according to a first embodiment. In FIG. 1, a signal-generating circuit 109 according to the first embodiment includes a voltage-controlled oscillator (VCO) 100, a first frequency divider 101, a second frequency divider 102, a phase comparator (PD) 103, a loop filter (LPF) 104, a third frequency divider 105, a frequency converter 106, and a multiplier 107. The voltage-controlled oscillator 100, the first frequency divider 101, the second frequency divider 102, the phase comparator 103, and the loop filter 104 are included in a PLL frequency synthesizer 99.

An output signal of the voltage-controlled oscillator 100 passes through the first frequency divider 101 and the second frequency divider 102 and is thereby converted to a lower frequency signal. The phase comparator 103 outputs a phase difference signal that is determined on the basis of a reference signal inputted from a reference signal input terminal 108 and an output signal of the second frequency divider 102. The phase difference signal outputted from the phase comparator 103 passes through the loop filter 104 to thereby have its low frequency component extracted, and the resulting signal is inputted to the voltage-controlled oscillator 100 as a frequency controlling signal therefor. The voltage-controlled oscillator 100 is an oscillator that has an oscillation frequency which is determined in accordance with a frequency controlling signal and which is adjusted to a desired oscillation frequency through feedback control.

An output signal of the first frequency divider 101 is inputted to the third frequency divider 105 and then to the frequency converter 106. The frequency converter 106 receives as input an output signal of the voltage-controlled oscillator 100 and an output signal of the third frequency divider 105.

The frequency converter 106 either extracts, from two sidebands generated through a multiplication of two input signals, a lower frequency component (lower sideband) or outputs an input signal from the voltage-controlled oscillator 100 without converting the frequency thereof. An output signal of the frequency converter 106 is converted to a frequency component of an integral multiple by the multiplier 107, and the resulting signal serves as an output signal of the signal-generating circuit 109.

Here, examples of numerical values will be indicated.

FIRST EXAMPLES OF NUMERICAL VALUES

Concerning the first examples of numerical values, as illustrated in FIG. 2, the following setting values are used. The division ratio of the first frequency divider 101 is set to "5," the division ratio of the second frequency divider 102 is set to "162," the frequency of the reference signal (reference frequency) is set to 40 MHz, the oscillation frequency of the voltage-controlled oscillator 100 is set to 32.4 GHz, and the multiplication number of the multiplier 107 is set to "2."

Here, as the division ratio of the third frequency divider 105 is switched among "2," "3," and "6," the generated output frequency of the signal-generating circuit 109 varies among 58.32 GHz, 60.48 GHz, and 62.64 GHz, respectively. Furthermore, the signal-generating circuit 109 outputs a signal at 64.80 GHz as the frequency converter 106 is set to a through mode in which an output signal of the third frequency divider 105 is not inputted to the frequency converter 106 or the third frequency divider 105 does not output an output signal and an output signal of the voltage-controlled oscillator 100 is thus outputted without being subjected to frequency conversion. By using the first examples of numerical values illustrated in FIG. 2, the signal-generating circuit 109 can handle the four channels used in the 60 GHz band.

SECOND EXAMPLES OF NUMERICAL VALUES

Concerning the second examples of numerical values, as illustrated in FIG. 3, the following setting values are used. The division ratio of the first frequency divider 101 is set to "5," the division ratio of the second frequency divider 102 is set to "81," the reference frequency is set to 40 MHz, the oscillation frequency of the voltage-controlled oscillator 100 is set to 16.2 GHz, the multiplication number of the multiplier 107 is set to "4," and the division ratio of the third frequency divider 105 is set to "2," "3," or "6."

Even with the second examples of numerical values, the signal-generating circuit 109 can generate a signal at four frequencies, namely, 58.32 GHz, 60.48 GHz, 62.64 GHz, and 64.80 GHz, that are required in the 60 GHz band by switching the division ratio of the third frequency divider 105 and by switching the frequency converter 106 to the through mode.

THIRD EXAMPLES OF NUMERICAL VALUES

Concerning the third examples of numerical values, generation of three frequencies that are required in channel bonding in the 60 GHz band will be described.

Concerning the third examples of numerical values, as illustrated in FIG. 4, the following setting values are used. The division ratio of the first frequency divider 101 is set to "1," the division ratio of the second frequency divider 102 is set to "162," the reference frequency is set to 40 MHz, the oscillation frequency of the voltage-controlled oscillator 100 is set to 32.4 GHz, the multiplication number of the multiplier 107 is set to "2," and the division ratio of the third frequency divider 105 is set to "12," "20," or "60."

The signal-generating circuit 109 can generate a signal at three frequencies, namely, 59.4 GHz, 61.56 GHz, and 63.72 GHz that are required in channel bonding in the 60 GHz band by switching the division ratio of the third frequency divider 105.

Figure 5:
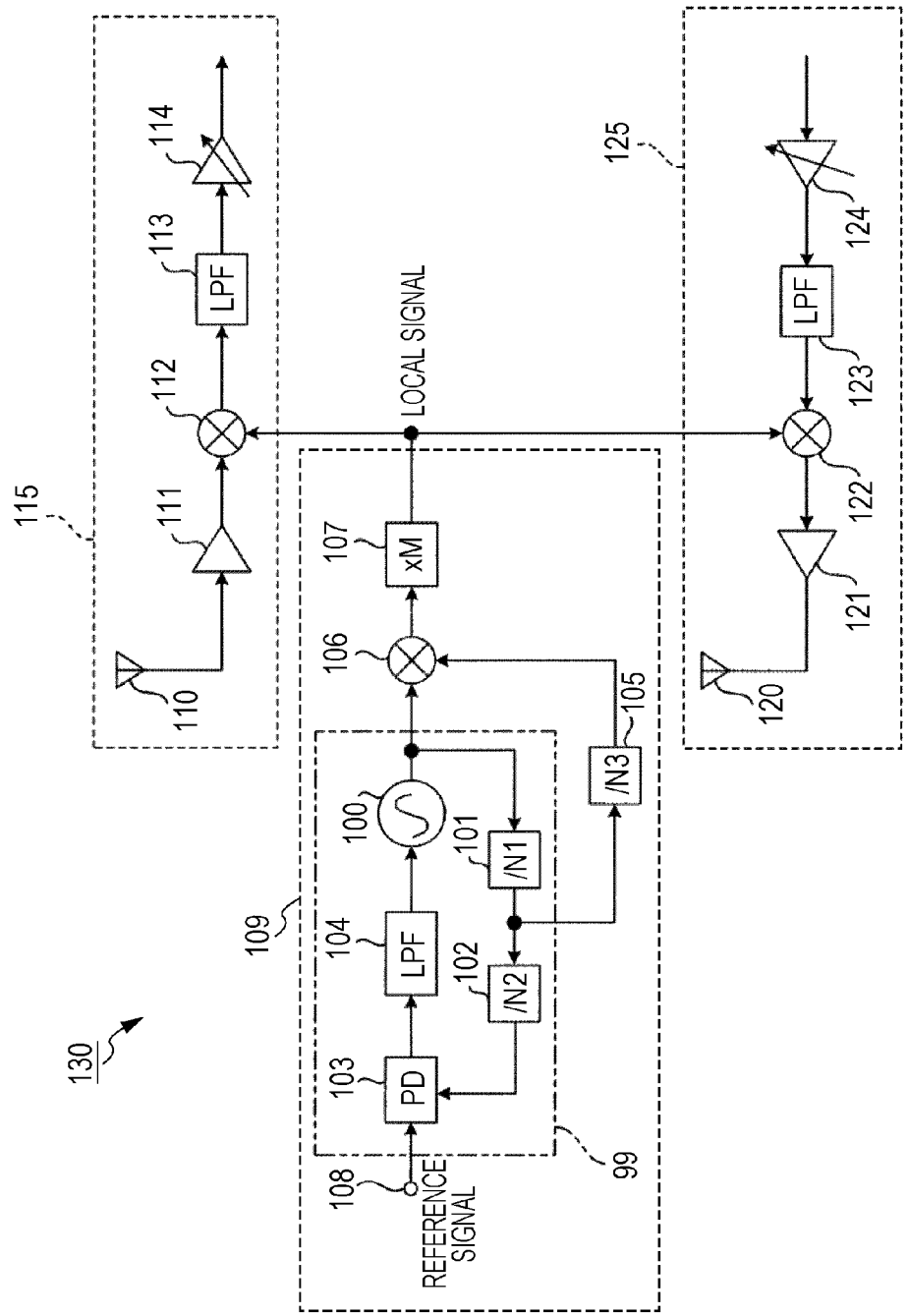
FIG. 5 is a block diagram illustrating a wireless communication device that includes the signal-generating circuit according to the first embodiment.

FIG. 5 is a block diagram illustrating a wireless communication device of a direct conversion system to which the signal-generating circuit 109 according to the first embodiment has been applied. In FIG. 5, a local signal generated by the signal-generating circuit 109 is supplied to each of a reception system 115 and a transmission system 125 of a wireless communication device 130. The reception system 115 includes a receiving antenna 110, a low-noise amplifier 111, a demodulator 112, a low-pass filter (LPF) 113, and a variable gain amplifier 114. The transmission system 125 includes a transmitting antenna 120, a high-power amplifier 121, a modulator 122, a low-pass filter (LPF) 123, and a variable gain amplifier 124.

In the reception system 115, a high-frequency signal received through the receiving antenna 110 is amplified by the low-noise amplifier 111 and is then converted to a baseband signal by the demodulator 112. An output signal of the demodulator 112 passes through the low-pass filter 113 and the variable gain amplifier 114 and is then outputted to a digital signal processor (not illustrated). In the transmission system 125, a transmission modulation signal outputted from a digital signal processor (not illustrated) passes through the variable gain amplifier 124 and the low-pass filter 123 and is then outputted to the modulator 122. In the modulator 122, an input signal is multiplied by a local signal from the signal-generating circuit 109 and thereby has the frequency thereof converted. The resulting signal is amplified by the high-power amplifier 121 to a desired transmission power level and is then radiated through the transmitting antenna 120. Quadrature demodulators are used in the demodulator 112 and the modulator 122, and thus a resulting baseband signal contains two systems of an in-phase component and a quadrature component, which are, however, not illustrated in FIG. 5.

With the signal-generating circuit 109 according to the first embodiment, a signal generated by dividing an output of the first frequency divider 101 provided on a feedback path in the PLL frequency synthesizer 99 with the division ratio being switched in accordance with a desired frequency is multiplied by an output signal from the PLL frequency synthesizer 99, and the resulting signal is then multiplied. Thus, four frequencies that are required in a wireless system of the 60 GHz band can be generated by using a single frequency converter 106. Furthermore, it is not necessary to broaden the variable frequency range of the voltage-controlled oscillator 100, and thus low-phase-noise characteristics can be realized. In other words, a signal-generating circuit that has a simple configuration and that can achieve both a broad variable frequency range and low-phase-noise characteristics at a high frequency can be realized.

In addition, with the signal-generating circuit 109 according to the first embodiment, the signal-generating circuit 109 can be applied to the wireless communication device 130 of a direct conversion system, and thus a chip area to be secured when the wireless communication device 130 is integrated in a semiconductor process can be reduced, and the fabrication cost can thus be reduced.

(Second Embodiment)

Figure 6:
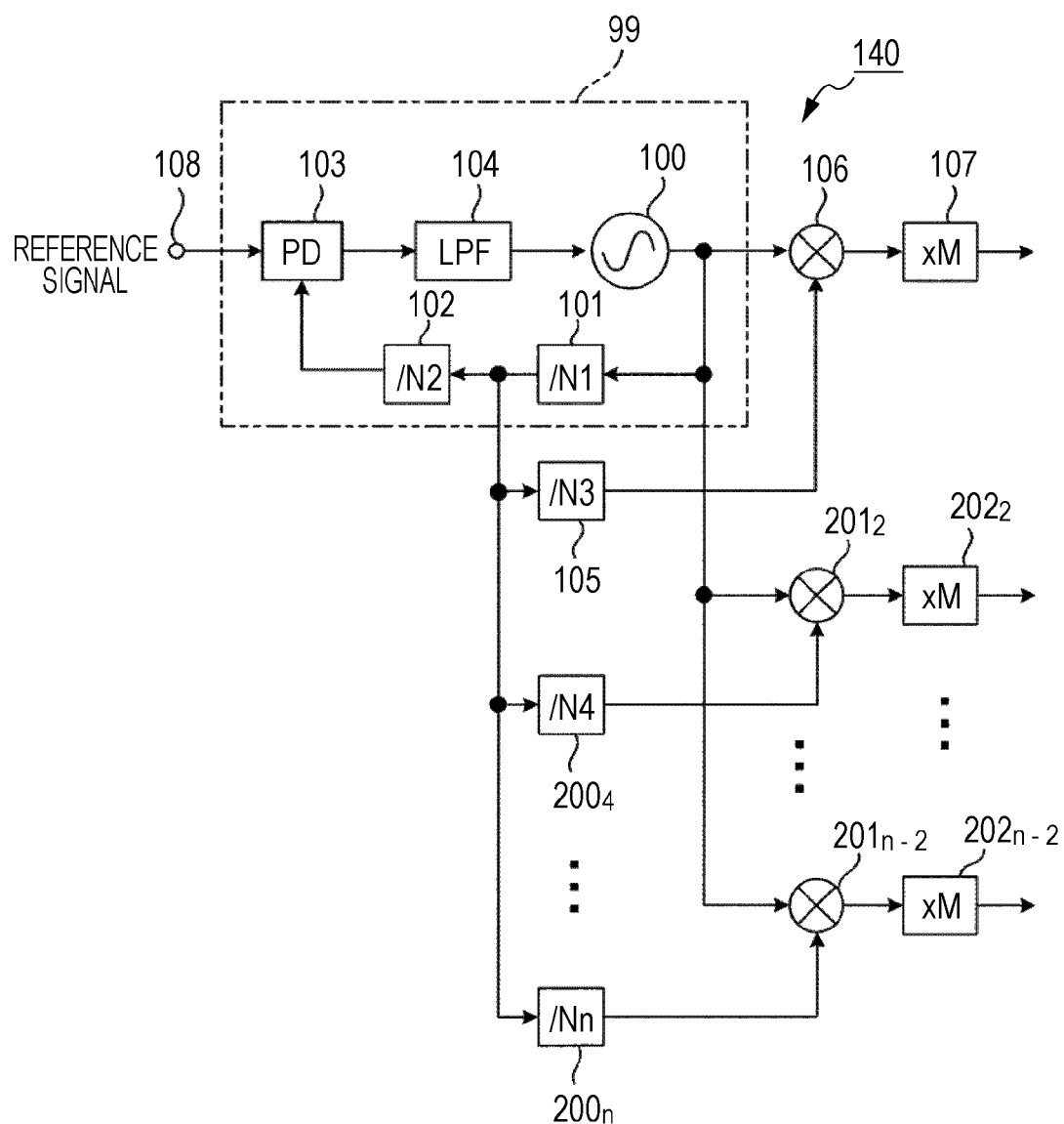
FIG. 6 is a block diagram illustrating a signal-generating circuit according to a second embodiment.

FIG. 6 is a block diagram illustrating a signal-generating circuit according to a second embodiment. In FIG. 6, elements that are common to those illustrated in FIG. 1 described above are given identical reference characters. A signal-generating circuit 140 according to the second embodiment illustrated in FIG. 6 has a configuration similar to that of the signal-generating circuit 109 according to the first embodiment, and includes a voltage-controlled oscillator 100, a first frequency divider 101, a second frequency divider 102, a phase comparator (PD) 103, a loop filter (LPF) 104, a third frequency divider 105, a frequency converter 106, and a multiplier 107. The signal-generating circuit 140 further includes a fourth frequency divider $200_4$ through an nth frequency divider $200_n$ (here, n is an integer equal to or greater than 4), a second frequency converter $201_2$ through an n–2th frequency converter $201_{n-2}$ provided in a number that is the same as the number of the fourth frequency divider $200_4$ through the nth frequency divider $200_n$ (here, n is an integer equal to or greater than 4), and a second multiplier $202_2$ through an n–2th multiplier $202_{n-2}$ provided in a number that is the same as the number of the fourth frequency divider $200_4$ through the nth frequency divider $200_n$ (here, n is an integer equal to or greater than 4).

An output signal of the first frequency divider 101 is inputted to each of the third frequency divider 105, the fourth frequency divider $200_4$, . . . , and the nth frequency divider $200_n$. The second frequency converter $201_2$ receives as input an output signal of the fourth frequency divider $200_4$ and an output signal of the voltage-controlled oscillator 100. An output signal of the second frequency converter $201_2$ is converted to a frequency component of an integral multiple by the second multiplier $202_2$, and the resulting signal serves as a second output signal.

The n–2th frequency converter $201_{n-2}$ receives as input an output signal of the nth frequency divider $200_n$ and an output signal of the voltage-controlled oscillator 100. An output signal of the n–2th frequency converter $201_{n-2}$ is converted to a frequency component of an integral multiple by the n–2th multiplier $202_{n-2}$, and the resulting signal serves as an n–2th output signal.

In the frequency conversion by the first frequency converter 106 and the second frequency converter $201_2$ through the n–2th frequency converter $201_{n-2}$ according to the present embodiment, of two sidebands generated through a multiplication of two input signals, a lower frequency component is extracted, or an input signal from the voltage-controlled oscillator 100 is outputted without having the frequency thereof being converted.

Operations of the fifth frequency divider $200_5$ (not illustrated) through the n−1th frequency divider $200_{n-1}$, operations of the third frequency converter $201_3$ (not illustrated) through the n−3th frequency converter $201_{n-3}$, and operations of the third multiplier $202_3$ (not illustrated) through the n−3th multiplier $202_{n-3}$ are similar to the operations of the fourth frequency divider $200_4$ and the nth frequency divider $200_n$, the operations of the second frequency converter $201_2$ and the n−2th frequency converter $201_{n-2}$, and the operations of the second multiplier $202_2$ and the n−2th multiplier $202_{n-2}$ described above, and thus descriptions thereof will be omitted. In addition, the operations of elements in the signal-generating circuit 140 that are identical to those of the signal-generating circuit 109 according to the first embodiment are identical to the operations described above, and thus descriptions thereof will be omitted.

With the signal-generating circuit 140 according to the second embodiment, as the division ratio of each of the first frequency divider 101, the second frequency divider 102, the third frequency divider 105, and the fourth frequency divider $200_4$ through the nth frequency divider $200_n$ is set individually, signals at a plurality of different frequencies can be generated by a single PLL frequency synthesizer 99.

Here, examples of numerical values will be indicated.

FOURTH EXAMPLES OF NUMERICAL VALUES

Concerning the fourth examples of numerical values, a case in which signals at the same frequency are outputted from the first multiplier 107 and the second multiplier $202_2$ will be described.

Concerning the fourth examples of numerical values, by setting n=4 and by using the setting values illustrated in FIG. 2, the division ratio of the first frequency divider 101 is set to "5," the division ratio of the second frequency divider 102 is set to "162," the reference frequency is set to 40 MHz, the oscillation frequency of the voltage-controlled oscillator 100 is set to 32.4 GHz, the multiplication number of the multiplier 107 is set to "2," the division ratio of the third frequency divider 105 is set to "6," and the division ratio of the fourth frequency divider $200_4$ is set to "6."

With the fourth examples of numerical values, output signals of the first multiplier 107 and the second multiplier $202_2$ can both be set to 58.32 GHz.

FIFTH EXAMPLES OF NUMERICAL VALUES

Concerning the fifth examples of numerical values, a case in which signals at different frequencies are outputted from the first multiplier 107, the second multiplier $202_2$, and the third multiplier $202_3$ will be described.

Concerning the fifth examples of numerical values, by setting n=5 and by using the setting values illustrated in FIG. 2, the division ratio of the first frequency divider 101 is set to "5," the division ratio of the second frequency divider 102 is set to "162," the reference frequency is set to 40 MHz, the oscillation frequency of the voltage-controlled oscillator 100 is set to 32.4 GHz, the multiplication number of the multiplier 107 is set to "2," the division ratio of the third frequency divider 105 is set to "6," the division ratio of the fourth frequency divider $200_4$ is set to "3," and the division ratio of the fifth frequency divider $200_5$ is set to "2."

With the fifth examples of numerical values, the output signal of the first multiplier 107 can be set to 58.32 GHz, the output signal of the second multiplier $202_2$ can be set to 60.48 GHz, and the output signal of the third multiplier $202_3$ can be set to 62.64 GHz.

Figure 7:
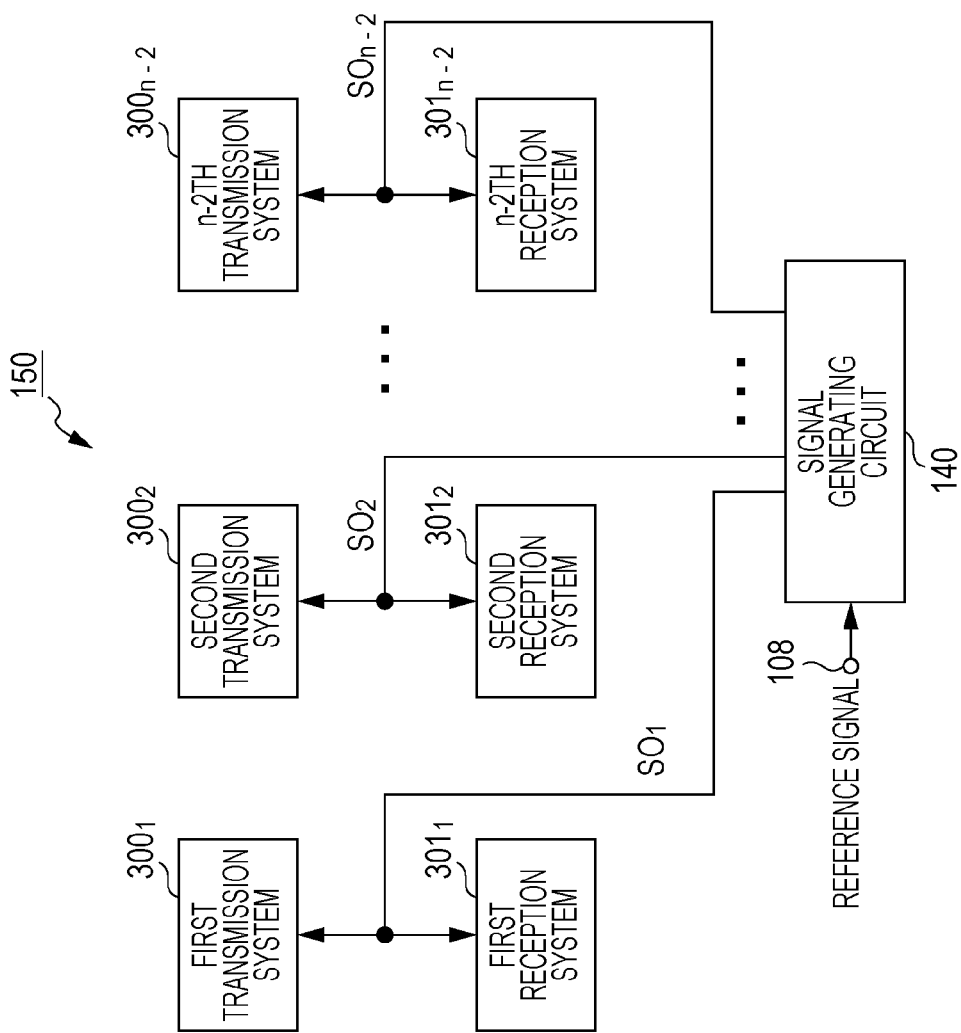
FIG. 7 is a block diagram illustrating a multi-system wireless communication device that includes the signal-generating circuit according to the second embodiment.

FIG. 7 is a block diagram illustrating a multi-system wireless communication device that includes the signal-generating circuit 140 according to the second embodiment. In FIG. 7, a first output signal $SO_1$ outputted from the signal-generating circuit 140 of a wireless communication device 150 is supplied to a first transmission system $300_2$ and a first reception system $301_2$. A second output signal $SO_2$ is supplied to a second transmission system $300_2$ and a second reception system $301_2$. An n−2th output signal $SO_{n-2}$ is supplied to an n−2th transmission system $300_{n-2}$ and an n−2th reception system $301_{n-2}$.

According to the configuration illustrated in FIG. 7, the carrier frequencies of the first through n−2th transmission systems $300_1$ through $300_{n-2}$ and the first through n−2th reception systems $301_1$ through $301_{n-2}$ can be set independently from one another. Frequencies can be used efficiently and the transmission rate can be increased by setting the same carrier frequency indicated in the fourth examples of numerical values or by setting different frequencies indicated in the fifth examples of numerical values in the plurality of transmission systems $300_1$ through $300_{n-2}$ and the plurality of reception systems $301_1$ through $301_{n-2}$ in accordance with the radio wave usage condition or the propagation environment.

Thus far, the first and second embodiments have been described with reference to the drawings, it is needless to say, however, that the present disclosure is not limited to these examples. It is apparent that a person skilled in the art can conceive of various modified examples and revised examples within the spirit of the appended claims, and it is appreciated that such modified examples and revised examples are encompassed by the technical scope of the present disclosure.

Although 58.32 GHz, 60.48 GHz, 62.64 GHz, and 64.80 GHz that are used in the 60 GHz band have been described as examples of numerical values of the frequency to be generated in the first and second embodiments described above, the frequency to be generated is not limited to such examples. In addition, the number of frequencies that can be generated is not limited to four.

Furthermore, the oscillation frequency of the voltage-controlled oscillator 100 does not necessarily need to be fixed and can be changed in accordance with a desired frequency.

(Overview of One Aspect of the Present Disclosure)

A first signal-generating circuit according to the present disclosure is a signal-generating circuit that outputs a high-frequency signal while switching among a plurality of frequencies and includes a voltage-controlled oscillator that generates a oscillated signal, a first frequency divider that generates a first divided signal by dividing a oscillated signal, a second frequency divider that generates a second divided signal by dividing the divided signal, a phase comparator that receives as input the second divided signal and a reference signal and outputs two signals corresponding to a phase difference between the second divided signal and the reference signal, a loop filter that extracts a low frequency signal between the two signals and outputs the low frequency signal to the voltage-controlled oscillator as a frequency controlling signal therefor, a third frequency divider that generates a third divided signal by dividing the first divided signal, a first frequency converter that generates a first frequency converted signal by multiplying the oscillated signal by the third divided signal, and a first multiplier that generates a multiplied signal by multiplying the first frequency converted signal by a first multiplication number.

A second signal-generating circuit according to the present disclosure is the first signal-generating circuit that further includes fourth through nth frequency dividers that generate fourth through nth divided signals by dividing the first divided signal (n being an integer equal to or greater than 4), second through n−2th frequency converters that generate second through n−2th frequency converted signals by multiplying the oscillated signal by respective the fourth through nth divided signals, and second through n−2th multipliers that generate the second through n−2th multiplied signals by multiplying respective the second through n−2th frequency converted signals by second through n−2th multiplication numbers.

A third signal-generating circuit according to the present disclosure is the first or second signal-generating circuit, in which a division ratio of the first frequency divider includes 5.

A fourth signal-generating circuit according to the present disclosure is the third signal-generating circuit, in which a division ratio of the third frequency divider includes 2, 3, or 6.

A fifth signal-generating circuit according to the present disclosure is the fourth signal-generating circuit, in which the first through n−2th multiplication numbers are 2 or 4 (n is an integer equal to or greater than 4).

A sixth signal-generating circuit according to the present disclosure is any one of the first through fifth signal-generating circuits, in which frequencies of the first through n−2th multiplied signals include any one of 58.32 GHz, 60.48 GHz, 62.64 GHz, and 64.80 GHz (n is an integer equal to or greater than 4).

A seventh signal-generating circuit according to the present disclosure is any one of the first through sixth signal-generating circuits, in which an oscillation frequency of the voltage-controlled oscillator is 32.4 GHz or 16.2 GHz.

An eighth signal-generating circuit according to the present disclosure is any one of the second signal-generating circuits, in which outputs of the first through n−2th multipliers are used as local signals of a direct conversion wireless device (n is an integer equal to or greater 4).

A wireless communication device according to the present disclosure includes any one of the first through eighth signal-generating circuits.

INDUSTRIAL APPLICABILITY

The present disclosure can be used effectively in a wireless communication device that enables high-speed wireless communication (IEEE 802.11ad, etc.) that uses, for example, a 60 GHz band, or millimeter waves.

What is claimed is:

1. A signal-generating circuit that outputs a high-frequency signal while switching among a plurality of frequencies, the signal-generating circuit comprising:
   a voltage-controlled oscillator that generates an oscillated signal;
   a first frequency divider that generates a first divided signal by dividing the oscillated signal;
   a second frequency divider that generates a second divided signal by dividing the divided signal;
   a phase comparator that receives, as input, the second divided signal and a reference signal and outputs a signal corresponding to a phase difference between the second divided signal and the reference signal;
   a loop filter that extracts a low frequency component included in the signal corresponding to the phase difference and outputs the extracted low frequency component to the voltage-controlled oscillator as a frequency controlling signal therefor;
   a third frequency divider that generates a third divided signal by dividing the first divided signal;
   a first frequency converter that generates a first frequency converted signal by multiplying the oscillated signal by the third divided signal; and
   a first multiplier that generates a multiplied signal by multiplying the first frequency converted signal by a first multiplication number.

2. The signal-generating circuit according to claim 1, further comprising:
   fourth through nth frequency dividers that generate fourth through nth divided signals by dividing the first divided signal, n being an integer equal to or greater than 4;
   second through n-2th frequency converters that generate second through n-2th frequency converted signals by multiplying the oscillated signal by respective the fourth through nth divided signals; and
   second through n-2th multipliers that generate the second through n-2th multiplied signals by multiplying respective the second through n-2th frequency converted signals by second through n-2th multiplication numbers.

3. The signal-generating circuit according to claim 2, wherein the first through n-2th multiplication numbers are 2 or 4, n being an integer equal to or greater than 4.

4. The signal-generating circuit according to claim 2, wherein frequencies of the first through n-2th multiplied signals include any one of 58.32 GHz, 60.48 GHz, 62.64 GHz, and 64.80 GHz, n being an integer equal to or greater than 4.

5. The signal-generating circuit according to claim 2, wherein the first through n-2th multiplied signals are used as local signals of a direct conversion wireless device, n being an integer equal to or greater 4.

6. The signal-generating circuit according to claim 1, wherein a division ratio of the first frequency divider includes 5.

7. The signal-generating circuit according to claim 6, wherein a division ratio of the third frequency divider includes 2, 3, or 6.

8. The signal-generating circuit according to claim 1, wherein an oscillation frequency of the voltage-controlled oscillator is 32.4 GHz or 16.2 GHz.

9. A wireless communication device, comprising:
the signal-generating circuit according to claim 1.

* * * * *